United States Patent
Eichler et al.

(10) Patent No.: US 8,830,658 B2
(45) Date of Patent: Sep. 9, 2014

(54) SWITCHGEAR CABINET ARRANGEMENT OF A DEVICE FOR PRODUCING ELECTRIC ENERGY

(71) Applicants: Markus Eichler, Kempen (DE); Hans-Georg Nowak, Möchengladbach (DE); Marianne Hitpaβ, Krefeld (DE)

(72) Inventors: Markus Eichler, Kempen (DE); Hans-Georg Nowak, Möchengladbach (DE); Marianne Hitpaβ, Krefeld (DE)

(73) Assignee: Woodward Kempen GmbH, Kempen (DE)

( * ) Notice: Subject to any disclaimer, the term of this patent is extended or adjusted under 35 U.S.C. 154(b) by 0 days.

(21) Appl. No.: 14/045,360

(22) Filed: Oct. 3, 2013

(65) Prior Publication Data

US 2014/0035289 A1    Feb. 6, 2014

Related U.S. Application Data

(63) Continuation of application No. PCT/EP2012/056219, filed on Apr. 4, 2012.

(30) Foreign Application Priority Data

Apr. 4, 2011 (DE) .......................... 10 2011 001 786

(51) Int. Cl.
| | |
|---|---|
| H02B 1/00 | (2006.01) |
| H02B 1/56 | (2006.01) |
| H02P 27/04 | (2006.01) |
| H02B 1/32 | (2006.01) |
| H05K 7/14 | (2006.01) |
| H05K 7/20 | (2006.01) |
| H02B 13/02 | (2006.01) |
| F03D 9/00 | (2006.01) |
| H02M 7/493 | (2007.01) |
| H02M 7/00 | (2006.01) |

(52) U.S. Cl.
CPC ................ *H02B 1/32* (2013.01); *Y02E 10/725* (2013.01); *H02B 1/565* (2013.01); *H05K 7/1432* (2013.01); *H02M 7/493* (2013.01); *H05K 7/2039* (2013.01); *H02B 13/02* (2013.01); *F03D 9/002* (2013.01); *H02M 7/003* (2013.01)
USPC ........... 361/677; 361/678; 361/689; 361/690; 363/56.01; 318/800

(58) Field of Classification Search
None
See application file for complete search history.

(56) References Cited

U.S. PATENT DOCUMENTS 5,504,655 A * 4/1996 Underwood et al. ......... 361/707
5,793,623 A * 8/1998 Kawashima et al. ...... 363/56.05

(Continued)

FOREIGN PATENT DOCUMENTS

DE        4412990 A1    10/1995
DE    102006050289 A1     4/2008

(Continued)

*Primary Examiner* — Boris Chervinsky
(74) *Attorney, Agent, or Firm* — Reinhart Boerner Van Deuren P.C.

(57) ABSTRACT

The invention relates to a switch cabinet arrangement of a device for generating electrical energy, wherein the switch cabinet arrangement comprises at least two separate power switch cabinets. The technical object of achieving an optimum scalability of devices for generating electrical energy with at the same time a simple installation and maintenance of the power switch cabinets despite a small available installation space, is achieved according to the invention in that the power switch cabinets respectively comprise a machine connection, a power module, a mains connection and a decentralised control unit, wherein the power module comprises a machine converter, a mains converter, a direct voltage intermediate circuit and a chopper, and wherein the power switch cabinets are electrically connected in parallel to one another via the machine connection and the mains connection.

16 Claims, 8 Drawing Sheets

(56) References Cited

U.S. PATENT DOCUMENTS

| | | | |
|---|---|---|---|
| 6,856,041 B2* | 2/2005 | Siebenthaler et al. | 290/44 |
| 7,518,256 B2* | 4/2009 | Juanarena Saragueta et al. | 290/44 |
| 7,545,052 B2 | 6/2009 | Llorente González et al. | |
| 7,804,271 B2* | 9/2010 | Yamai et al. | 318/800 |
| 7,859,838 B2 | 12/2010 | Pesonen | |
| 7,989,977 B2* | 8/2011 | Crane | 307/8 |
| 8,080,973 B2* | 12/2011 | King et al. | 320/104 |
| 8,373,293 B2* | 2/2013 | Engelhardt et al. | 290/44 |
| 8,395,874 B2* | 3/2013 | Yamai et al. | 361/111 |
| 8,503,209 B2* | 8/2013 | Tokuyama et al. | 363/141 |
| 8,640,799 B2* | 2/2014 | Beeson | 180/53.5 |
| 8,699,254 B2* | 4/2014 | Nishikimi et al. | 363/141 |

FOREIGN PATENT DOCUMENTS

| | | |
|---|---|---|
| DE | 102008034417 A1 | 10/2009 |
| DE | 102008037449 A1 | 4/2010 |
| EP | 1 903 848 B1 | 9/2010 |
| WO | WO 2007115951 A1 | 10/2007 |
| WO | WO 2010/108928 A1 | 9/2010 |

* cited by examiner

SWITCHGEAR CABINET ARRANGEMENT OF A DEVICE FOR PRODUCING ELECTRIC ENERGY

CROSS-REFERENCE TO RELATED PATENT APPLICATIONS

This patent application is a continuation of pending PCT Application No. PCT/EP2012/056219, filed Apr. 4, 2012, which claims the benefit of German Application No. 102011001786.0, filed Apr. 4, 2011, the entire teachings and disclosure of which are incorporated herein by reference thereto.

FIELD OF THE INVENTION

The invention relates to a switch cabinet arrangement of a device for generating electrical energy, in which the switch cabinet arrangement comprises at least two separate power switch cabinets.

BACKGROUND OF THE INVENTION

It is known from the prior art to arrange electronic components, such as converters or filters, in particular of devices for generating electrical energy, in power switch cabinets. Wind turbines are often equipped with doubly-fed asynchronous machines, since in this way only partial outputs have to be transported via the converters of the equipment. However, with rotational speeds below the synchronous rotational speed of the generator the efficiency of the equipment drops. Accordingly, synchronous machines with full power converters are increasingly used. In these systems, however, the overall power to be supplied to the mains is fed through a converter, so that these have to be suitably dimensioned and constructed so that they are scaleable. Furthermore, due to the required relatively larger outputs additional demands are for example placed on cooling, combined at the same time with a compact construction of the switch cabinets.

The printed specification EP1903848B1 describes a modular frequency converter, in which the power electronics part is provided with wheels, as well as an installation cabinet for accommodating the power electronics part. Complicated and costly plug-and-socket connections are necessary to connect the power electronics part to the remainder of the frequency converter.

The printed specification U.S. Pat. No. 7,545,052 B2 describes a method that is intended to improve the efficiency and the reliability of converter modules in a current generation device in a wind turbine. For this purpose the wind turbine comprises a plurality of converter modules, which are connected in parallel on both the generator side and the mains side, and in which the converter modules can be independently switched on and off depending on a parameter. In order to prevent overheating, the converter modules should for example be operated alternately or switched on and off corresponding to the power produced by the generator. During the switching on and off procedure the converter modules pass through several specific switching states, which are regulated from a central CPU. This requires a complicated cabling between the central CPU and the converter modules. Furthermore, in the event of a defect the complete module has to be replaced.

The printed specification U.S. Pat. No. 7,859,838 B2 relates to an arrangement for accommodating a converter or frequency changer in a switch cabinet. The frame of the switch cabinet should in this connection be of modular construction, so that the components of the frequency converter can be installed in the switch cabinet frame modules before the switch cabinet is brought to the installation site. The disadvantage in this case however is that the individual components of the frequency converter are distributed in various cabinets, which furthermore requires complicated cabling. After the installation in the factory a subsequent scalability in situ is possible only with considerable effort and expenditure. In addition the individual frame modules require a relatively large amount of space.

SUMMARY OF THE INVENTION

The present invention is therefore based on the technical object of achieving an optimum scalability of devices for generating electrical energy with at the same time simple installation and maintenance of the power switch cabinets despite a small available installation space.

The technical object is achieved according to the invention in that the power switch cabinets respectively comprise a machine connection, a power module, a mains connection and a decentralised control unit, wherein the power module comprises a machine converter, a mains converter, a direct voltage intermediate circuit and a chopper, and wherein the power switch cabinets are electrically connected in parallel to one another via the mains connection and optionally via the machine connection. The machine connections can be electrically connected in parallel and then connected to the winding of the machine. When using a machine with separate windings it is also conceivable for the machine connections to be electrically connected separately to the respective windings.

The provision of these components in the respective power switch cabinets and their cooperation permits an optimum scalability of a device for generating electrical energy. In fact substantially independent power switch cabinets are made available, with which the output can be scaled in a very simple manner by adapting the number of power switch cabinets.

On account of the machine and mains connections provided in the power switch cabinet and the power module, which comprises in addition to the mains and machine converters also a chopper for short-circuiting the respective intermediate circuit, it is possible to arrange the components so that there are only minimal connection paths between the individual components. These short connection paths lead on the one hand to a high output density and thus to a very compact arrangement, and on the other hand therefore also to cost savings. The choice of the components that the power switch cabinets comprise also enables an optimum power flow to be achieved, since apart from the machine and mains connections no cross connections to other power switch cabinets are necessary, which would lead to complicated crossings of cable paths.

Above all the existence of a decentralised control unit allows an optimisation of the flexibility with regard to the installation of the power switch cabinets and the scalability. The individual components of a power switch cabinet do not have to be triggered individually, but instead they can all be operated internally from the decentralised control unit. This can preferably communicate with all relevant implemented components, i.e. with all actuators and sensors of the power switch cabinet, in particular however with the power module. Also, temperature or moisture sensors can also be read or monitored for monitoring purposes. On account of the short signal paths a decentralised control device allows the use of simple electrical data connections, for example to the drivers of the IGBTs and other sensors and actuators. With long signal paths it is only possible to use optical fibres on account of the strong electromagnetic interference signals. As a result the optical signals often have to be converted again into electrical signals. The communication with the components contained in the power switch cabinet is accordingly significantly simplified. The decentralised control units can be connected via simple data connections to a central control unit. The number of the necessary connections and cablings is therefore reduced to a minimum. Preferably the decentralised control units are formed so that these can communicate via a connection through an optical fibre for example to a central control unit. The decentralised control units can then communicate for example with further systems, such as further control units. In this connection a star-shaped, annular, row and/or bus topology of the decentralised control units can be provided.

The machine connections of the at least two power switch cabinets are connected, preferably via further components such as switches or also a generator connection cabinet, which can include switches and/or protective elements, to an electrical machine, for example a generator or a motor. The at least two power switch cabinets are in this connection connected in parallel. The machine connection is preferably formed as a connecting busbar, although other connections such as cable connections are conceivable. Connecting busbars are mechanically robust and provide in a simple manner the necessary cross-sections for transporting high outputs. Furthermore they allow a simple connection, likewise having large cross-sections, between two connecting busbars. Also on the mains side connecting busbars can be used for the parallel connection of the power switch cabinets.

The machine and the mains converters of the power module preferably comprise electronic power switches in order to convert alternating current into direct current, or vice versa. These electronic switches may for example be diodes, transistors, integrated-gate-communicated thyristors (IGCT) or preferably insulated-gate-bipolar transistors (IGBT). The latter allow an almost powerless triggering, combined with an above-average robustness and a compact structure. These electronic power switches are in particular designed so that they can be installed individually or as a module comprising a plurality of electronic power switches, in or on the power modules.

The energetic coupling on a common direct voltage level of the two power networks electrically connected through the converter is preferably achieved by capacitors, which form the direct voltage intermediate circuit.

The provision of a chopper enables electrical energy to be converted into thermal energy and dissipated by means of an electronic power switch, via a so-called braking resistance. An IGBT is again particularly suitable as electronic power switch, although other electronic power switches are also possible. The provision of a chopper in each power switch cabinet is particularly advantageous, since energy can thereby be dissipated in each direct voltage intermediate circuit. The choppers can therefore be adapted to the respective output of the individual switch cabinet. If the device is expanded, a new dimensioning of the chopper, as would be necessary in the case of parallel-connected direct voltage intermediate circuits, is no longer necessary. In addition protection systems can be omitted on account of the limited amount of energy that has to be dissipated via the chopper. In principle the chopper can for example be positioned arbitrarily via cable connections in the power switch cabinet. It is however particularly advantageous if the chopper is arranged between the mains and the machine converter on a direct current busbar comprising the capacitors of the direct voltage intermediate circuit. In this way a particularly short, symmetrical and direct connection to the direct voltage intermediate circuit is achieved, which has a positive effect on the compactness of the power switch cabinets and permits a uniform thermal loading of the capacitors. Furthermore it is possible to install the electronic power switch and the resistor of the chopper as a joint unit, or also, if the type of construction of the resistor does not allow this, to install the resistor spatially separated from the power switch.

When using a direct current busbar the direct voltage intermediate circuit can be implemented with a very low inductivity simply via two conductor planes with an intermediately positioned insulation. This leads to a particularly compact form of construction of the power module. For three-level converters a third direct current conductor plane can correspondingly be provided in the direct current busbar, so that a switch arrangement for the low-voltage operation and also for the medium-voltage operation can be provided without having to alter the mechanical construction of the power switch cabinets.

The power module with mains converter, direct voltage intermediate circuit, chopper and machine converter is connected via the two converters, preferably via copper busbars, to the mains and/or machine connections of the switch cabinet. Of course, further components may also be provided between the power module and mains and machine connections, which are likewise connected via copper busbars to the power module. Copper busbars permit a particularly low-loss electrical connection. However, it is also conceivable to provide cable connections suitably designed to be low-loss connections.

In this way a largely modular construction of the power switch cabinet components is achieved, so that the replacement of individual defective components can be carried out without additional measures.

A power switch cabinet is preferably designed for outputs of typically up to 1 MW, wherein low voltages of up to 1 kV as well as medium voltages of up to 30 kV can be used. Obviously larger outputs per power switch cabinet are however also conceivable. A scaling of the output of the power switch cabinets can be achieved for example on the one hand by adapting the type and/or number of the electronic power switches, and/or on the other hand in a particularly simple manner by providing a different number of power switch cabinets according to the invention.

It is particularly advantageous if in a power switch cabinet the arrangement of the components corresponds substantially to the direction of the power flow. An arrangement of the components substantially in a row is preferred. In this connection the order of the components is: machine connection, machine converter, direct voltage intermediate circuit with chopper, mains converter and mains connection. On account of ease of accessibility and thermal effects a substantially vertical arrangement of the components is particularly preferred, in which the arrangement of the components can be from top to bottom as well as from the bottom up, corresponding to the aforementioned order.

Overall a cost-saving, compact construction with minimal connection stretches between the components, and thereby with an optimal power flow and high power density combined with very good scalability, can be realised with a switch arrangement according to the invention.

As an alternative to the mains parallel connection of the power switch cabinets, the power switch cabinets can according to a first alternative configuration of the switch arrangement be connected in each case individually to the mains via associated secondary windings of one or a plurality of transformers. Here, transformers each with a primary and a secondary winding, or also transformers each with one primary winding and a plurality of secondary windings, can be used. This prevents the formation of circulating currents between a plurality of machine as well as mains parallel connected power switch cabinets.

According to a further modification of the switch cabinet arrangement according to the invention, the power module comprises a plate-shaped direct current busbar, which on a first side comprises the power switches and a chopper, and on a second side comprises the capacitor of the direct voltage intermediate circuit.

Due to the direct current busbar and the connection of the power switches and chopper on the one side and of the capacitors of the direct voltage intermediate circuit on the other side of the direct current busbar, a very space-saving arrangement of the power modules, which correspondingly have a high power density, can be achieved. In this way a simple access and thus a simple installation and a simple maintenance of the electronic switches also becomes possible.

The capacitors may in particular be connected via connecting elements of a first spacing in a conducting manner to the direct current busbar, while the at least one electronic power switch is connected via connecting elements of a second spacing in a conducting manner to the direct current busbar.

The second spacing of the direct current busbar allows the variable connection of one but also of a plurality of electronic power switches to the direct current busbar, so that a simple scalability of the circuit arrangement is provided. Connecting elements are preferably formed by contact holes in the respective metal plate of the electrical connecting pole of the direct current busbar, so that the individual capacitors and electronic power switches can be connected in an electrically conducting manner to the direct current busbar. The first spacing and the second spacing can be formed either identically or different from one another. The spatial requirement is thereby further reduced and moreover the scalability is simplified. Preferably a plurality of parallel-connected capacitors, preferably a capacitor bank, is provided, in which the individual capacitors can be connected in an electrically conducting manner to the direct current busbar via the connecting elements arranged in the first spacing. The first spacing of the direct current busbar allows a particularly compact arrangement of the capacitors, since the spacing can be adapted for example to the size and the spatial requirements of the capacitors.

Preferably the connecting elements of the direct current busbar arranged in the second spacing are formed so that a plurality of electronic power switches can be connected in an electrically conducting manner and axially symmetrical arrangement to the direct current busbar. For the connecting elements arranged in the second spacing this means that the electrical connecting poles permit for example the contacting of an electronic power switch rotated by 180°. The axially symmetrical arrangement of electronic power switches allows a symmetrical construction of the circuit arrangement and to this extent a further reduction of the spatial requirement of the power module and thus of the overall power switch cabinet.

Due to the provision of an adapter busbar that is adapted on one connecting side to the electronic switch and on the other side to the second spacing, electronic power switches of different manufacturers and/or different types can be used.

Naturally a plurality of direct current busbars electronically connected to one another can also be provided within a power switch cabinet, in order to achieve a scalability within a power switch cabinet. These can be connected via short copper busbars, cables or further busbars, laterally in series or back-to-back.

The chopper can either be electrically connected directly to the direct current busbar, or can be connected via a specific adapter busbar to the direct current busbar. If the chopper is directly connected to the direct current busbar, then on the one hand the costs for an adapter busbar are saved. The adapter busbar can however be used in order to arrange the chopper for a specific use on a suitable site of the circuit arrangement, without having to alter the direct current busbar.

Owing to the direct connection of the chopper to the direct current busbar very low leakage inductances are achieved and there is a uniform distribution of the currents through the direct current busbar and of the capacitors connected to the direct current busbar. In this way a uniform heat distribution is achieved, which in turn permits a more compact power switch cabinet that is easier to cool. Preferably the chopper is arranged between the electronic power switches of the mains converter and of the machine converter on one side of the direct current busbar.

According to a further modification of the switch cabinet arrangement according to the invention, the power switches comprise in each case a dU/dt filter. This enables voltage gradients to be limited. The dU/dt filter is in particular connected upstream of the machine connection, in other words is arranged between the machine converter and the machine connection, and protects the machine against too rapid voltage changes. Since the power switch cabinets have a dU/dt filter, further cablings leading out from the power switch cabinet are also avoided. A dU/dt filter comprises in particular a choke and optionally an RC wiring. The dU/dt filter can be connected up via busbars, such as copper busbars, cables or strands. In this way the modularity of the components is retained and a simplified maintenance can be achieved. A sensor for monitoring the temperature of the dU/dt filter can optionally communicate with the decentralised control unit.

Preferably the power switch cabinets comprise a line choke on the mains side. This serves the decoupling from the mains, so that disturbances in the mains, such as for example harmonic currents, can be minimised. The line choke can likewise be connected up via rails, such as copper busbars, cables or strands. In this way the modularity of the components is retained and a simplified maintenance can be achieved. In particular a flexible connection to a converter can be achieved by means of strand connections, which permits a quick installation or also the use of line chokes of different manufacturers. A sensor for monitoring the temperature of the line choke can also communicate with the decentralised control unit. In the case of a series arrangement of the components the line choke is preferably arranged between the mains connection and power module or, if a cooling device is present, between the mains connection and that of the cooling device. On account of thermal effects a substantially vertical arrangement is particularly preferred to achieve a more effective cooling, in which the line choke is arranged underneath the power module and the cooling device, respectively.

It is furthermore preferred if the power switch cabinets comprise isolation devices respectively connected upstream of the mains connections and/or the machine connections, i.e. arranged between the mains or machine converters and the mains or machine connections, for electrically isolating the power switch cabinets, for example electrical interruption devices such as contactors, IGBTs or IGBCs, or also mechanical switches. This allows a further simplification of maintenance work, since in this way individual power switch cabinets on the mains and/or machine can be disconnected from the mains. The contactors can for example be electrically connected via short copper connections to the respective connection. If a switch cabinet arrangement comprises for example at least partially redundant power switch cabinets, these themselves can be switched on or off during operation. A maintenance or a replacement of faulty components can therefore be carried out quickly and simply. In addition the efficiency is for example increased if the generator supplies different outputs and power switch cabinets can be switched off at lower outputs. Furthermore, if there is a fault in one of the power switch cabinets this can be electrically isolated from the others. Accordingly the whole system can continue to operate with reduced capacity and energy can be supplied to the mains. This is particularly important for offshore wind turbines, since these can be accessed only with difficulty.

According to a further modification of the switch cabinet arrangement according to the invention the power switch cabinets in each case comprise a cooling device, in particular a heat exchanger. The cooling can be effected via air cooling, for example by means of fans, but also by a heat exchanger. The heat exchanger preferably uses a coolant, in particular water. Advantageously a water-glycol mixture can also be used, although any other liquid coolant is also possible. Preferably however both methods are employed simultaneously, so that a correspondingly more compact construction can be realised. Components that can be cooled for example with water, which are generally the electronic power switches of the inverters and of the chopper, the dU/dt filters and the line chokes, are connected to a water cooling circulation. In the case of other components, such as for example the intermediate circuit capacitors, an air cooling is advantageous.

According to a further modification the power switch cabinets are preferably hermetically sealed against the surrounding air. In this case the use of heat exchangers, in particular an air-water heat exchanger, is advantageous, which feeds the waste heat from the components to the water cooling circuit, so that a supply of external cooling air is not necessary. Due to the use of heat exchangers a sufficient cooling of the components in the power switch cabinets is also ensured without any supplied air. The cooling circuits of the power switch cabinets can be connected up to one another or can also be operated independently of one another. On account of the different heat production of the individual components it is particularly advantageous if the individual components are aligned substantially in a vertical arrangement. In this case heat that is generated can be dissipated by natural convection. The cooling device is preferably arranged underneath the power module, so that the natural connection can be assisted. With a water-air heat exchanger an optimal cooling air circulation is thereby achieved, which cools the power module, in particular the capacitors arranged on a direct current busbar.

Cooling within a power switch cabinet can increase the service life of the components, in particular in climatically unfavourable regions, since it allows a hermetic construction of the power switch cabinet, and contamination of the components by moist, salt-containing or contaminated air from outside is avoided. Preferably the power module, i.e. in particular the machine and mains converter as well as the chopper, the line choke and/or the dU/dt filter are water cooled. Contactors provided on the mains and machine connections can optionally also be air cooled or water cooled.

In the case of water cooling a preheating device can also be provided, so that at very low ambient temperatures the power module, in particular the electronic power switches, can on the one hand be preheated to the operating temperature, and on the other hand condensation on these components after operation can be avoided.

Preferably the power switch cabinets are connected in parallel by means of A.C. rails. A simple to install and at the same time stable parallel connection of the individual power switch cabinets can thereby be realised. The A.C. rails are preferably of copper on account of its conductivity. In the case of three-phase alternating current at least three-pole busbars should be provided. The A.C. rails can therefore be arranged so that the connection to other power switch cabinets is possible laterally, rearwards and/or upwards. The front side of the power switch cabinets preferably serves for easy access for installation and maintenance purposes.

In principle cables and/or strands can however also be used to connect the power switch cabinets.

According to a further modification of the switch cabinet arrangement according to the invention the power switch cabinets are arranged laterally in series and/or back to back. In this way a simple output adaptation can be achieved despite a compact arrangement of the power switch cabinets.

According to a preferred modification of the switch cabinet arrangement according to the invention the switch cabinet arrangement comprises a mains connection switch cabinet, which contains a central control unit. The decentralised control units of the power switch cabinets can be controlled via the central control unit. If a connection is made between the decentralised control units and the central control unit, then each component of the power switch cabinets can be operated in a simple manner via the connection. If for example the switch cabinet arrangement is to be expanded by a further power switch cabinet, simply the mains and machine connection has to be electrically connected, and the decentralised control unit as well as the auxiliary supply are joined up. The number of necessary connections and cablings is therefore reduced to a minimum. In this connection a star-shaped, ring, series and/or bus topology of the decentralised control units can be provided. The use of a separate mains connection switch cabinet furthermore improves the scalability of the switch cabinet arrangement, since in the case of output adaptations this can be replaced or adapted separately from the power switch cabinets.

The central control unit can however also be designed so that it can communicate with further systems. Thus, various interfaces and bus systems such as Ethernet, CANOpen or other digital or analogue inputs and outputs can be provided, in order for example also to take account of or influence data of the generator or rotor.

The mains connection cabinet also serves to connect the power switch cabinets to the mains.

Preferably the mains connection switch cabinet comprises one or more mains filters. This serves to limit electrical interference into the mains as well as from the mains. Such a mains filter can be composed of inductances, capacitors and/or resistors. Owing to the fact that the mains filter is provided in the mains connection cabinet, it is connected upstream of all power switch cabinets and only one single filter has to be provided. It is in principle also possible however to integrate mains filters respectively into the power switch cabinets.

The mains connection switch cabinet preferably comprises an auxiliary voltage supply and/or a mains switch. The auxiliary voltage supply preferably generates a single-phase 230 V alternating voltage from the mains alternating current. Any suitable D.C. voltages and/or A.C. voltages are possible however. Likewise it is possible to feed the auxiliary voltage from outside, so that in this case the auxiliary voltage supply in the mains connection cabinet simply serves as a distribution node for the power switch cabinets. The auxiliary voltage supply can thus be provided in a simple manner for all power switch cabinets. All power switch cabinets can thus be isolated in a simple manner from the mains via one or a plurality of mains switches.

Preferably the central control unit and the decentralised control units are designed so that the central control unit and the decentralised control units can be connected to one another via optical fibres. In this way the necessary cable connections are reduced, which additionally simplifies the installation and the scalability. When using optical fibres signal interferences on account of possible high-frequency interfering pulses are avoided.

The object outlined above is achieved in particular by a device for generating electrical energy that comprises a switch cabinet arrangement according to the invention. As already discussed, a cost-saving, compact construction with minimal connecting paths between the components and therefore with an optimum power flow and high power density can be realised by means of a switch cabinet arrangement according to the invention.

This applies in particular to a further modified device according to the invention for generating electrical energy, which is designed as a wind turbine with a generator and comprises a switch cabinet arrangement according to the invention. As generators there may be used for example doubly-fed asynchronous machines or synchronous machines as mentioned in the introduction. Since wind turbines generate widely varying outputs depending on their size or wind strength at the installation site, the employed components and in particular the converters have to be able to be suitably adapted to this output. This is achieved in a particularly simple and cost-effective manner with the switch cabinet arrangement according to the invention. Furthermore the space available in wind turbines—for example inside a tower of a wind turbine—is in most limited, so that the compact construction of the power switch cabinets and thus also of the overall switch cabinet arrangement is advantageous. Particularly when using synchronous machines with full converters the overall electrical output is controlled via the converters, so that a more compact and scalable construction with at the same time optimal cooling is advantageous. For example a back-to-back arrangement of the power switch cabinets takes up minimum space, without impairing the accessibility and thus the ease of maintenance.

BRIEF DESCRIPTION OF THE DRAWINGS

The invention is described in more detail hereinafter with the aid of the description of exemplary embodiments in conjunction with the drawings, in which.

DETAILED DESCRIPTION OF THE INVENTION

Figure 1:
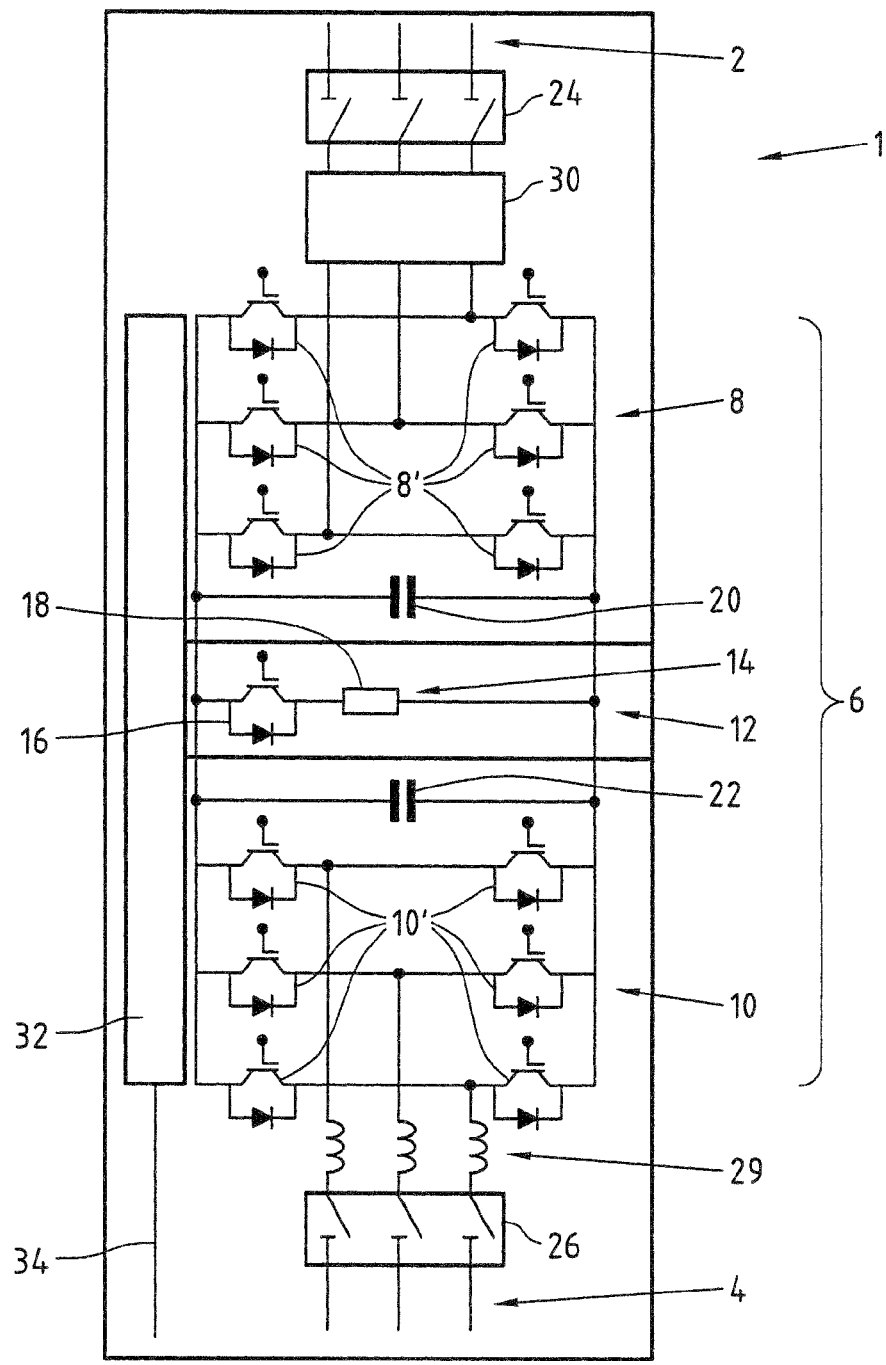
FIG. 1 shows schematically in the form of a circuit diagram the construction of an exemplary embodiment of a power switch cabinet.

FIG. 1 shows schematically in the form of a circuit diagram the construction of an embodiment of a power switch cabinet 1.

As can be seen from the circuit diagram, the power switch cabinet 1 comprises at a first end a machine connection 2 and at a second end a mains connection 4. In this exemplary embodiment both connections 2, 4 are formed with three conductors for providing three-phase current. These connections 2, 4 can be realised with cables or A.C. rails, preferably copper rails. A plurality of switch cabinets 1 can be connected in parallel via the machine connection 2 and electrically connected to a generator 68, for example a permanent-field synchronous machine. Via the mains connection 4 the power switch cabinet 1 is electrically connected to the mains, for example to a power supply network. Preferably the at least two power switch cabinets are connected in parallel via the mains connections 4. In this respect further components, such as switches or filters, in particular a mains connection switch cabinet 72, can also be connected up between the mains and mains connection 2.

A power module 6 is arranged between the connections 2, 4. This comprises a machine converter 8, a mains converter 10, a direct voltage intermediate circuit 12 and a chopper 14. The chopper 14 consists of an electronic power switch 16 and a braking resistor 18. The electronic power switch 16 is in this case an IGBT. The converters 8, 10 comprise a plurality of electronic power switches in the form of IGBTs 8', 10'. Other electronic power switches can however also be used. The direct voltage intermediate circuit 12 is indicated by two capacitors 20, 22, which are normally in the form of a capacitor bank 48 consisting of a plurality of capacitors connected in parallel.

The power switch cabinet 1 furthermore preferably comprises two contactors 24, 26, which are connected upstream of the connections 2, 4. With the aid of the contactors 24, 26 the whole switch cabinet 1 can be isolated as a unit from the mains as well as from the generator 68. This is particularly advantageous for maintenance and repair purposes, installations, or in the case of faults. The line choke 29 serves to decouple the converters and the mains.

In order to avoid voltage gradients in particular at the generator, a dU/dt filter 30 is preferably arranged between the machine converter 8 and the contactor 24.

The power switch cabinet 1 furthermore comprises a decentralised control unit 32. This can communicate with arbitrary components of the power switch cabinet 1, but preferably with all actuators and sensors in the power switch cabinet, for example with the converters 8, 10, the chopper 14 and/or the contactors 24, 26. In this way the power switch cabinet 1 substantially forms a unit, so that a switch cabinet arrangement 64, 96, 98 can easily be adapted to the output of a generator 68 by providing a corresponding number of power switch cabinets 1. The decentralised control unit is in this case connected via one, or typically two, optical fibres 34 to further control units. However, other transmission techniques by means of mains cables or also cable-free transmission methods are also conceivable. The decentralised control unit 32 allows in particular the implementation of short signal paths within the power switch cabinet itself, so that here simple electrical connections are possible despite the strong electromagnetic interference fields. In each case the required number of cable connections to a central control unit is reduced to a minimum by the provision of a decentralised control unit 32.

Basically the actual positioning of the components in a power switch cabinet 1 is not determined by the arrangement of the components of a circuit diagram. It is however advantageous if the components are arranged substantially in the same order as in the circuit diagram.

Figure 2:
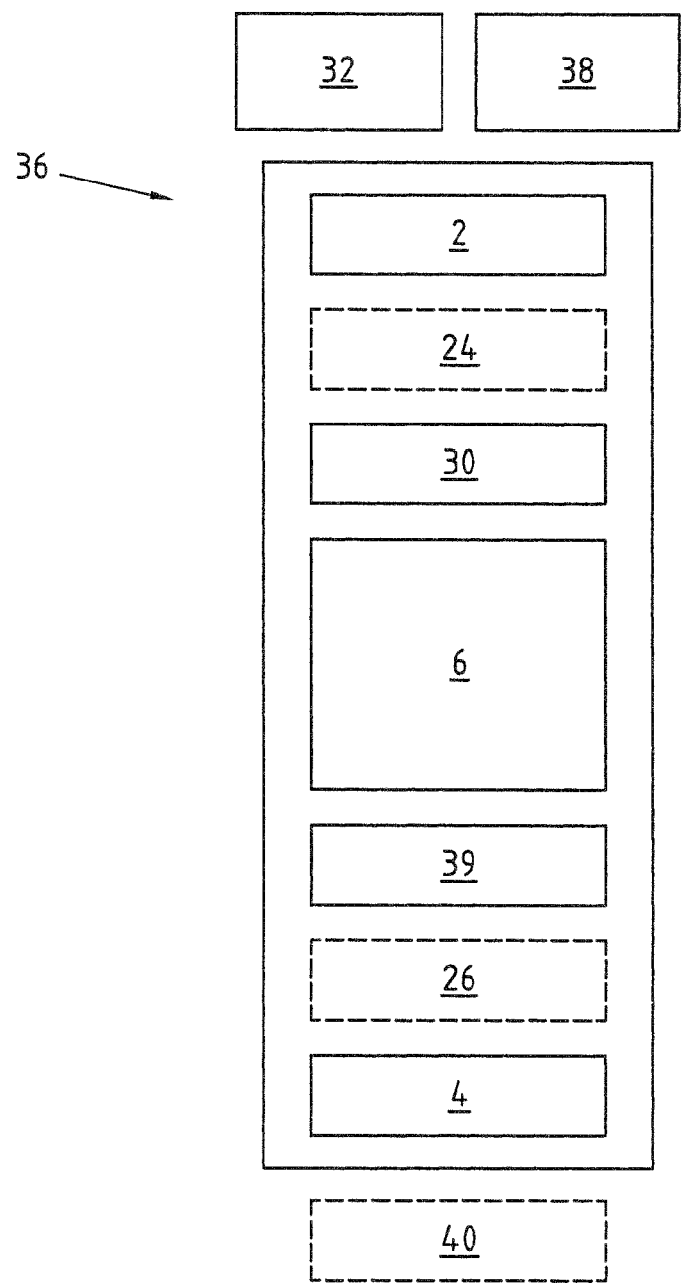
FIG. 2 shows schematically in the form of a block diagram the arrangement of the components of a further exemplary embodiment of a power switch cabinet.

FIG. 2 shows schematically in the form of a block diagram the arrangement of the components of a further exemplary embodiment of a power switch cabinet 36. In particular, the arrangement of the components substantially in one row in the order: machine connection 2, optionally machine contactor 24, dU/dt filter 30, power module 6, line choke 39, optionally mains contactor 26 and mains connection 2, is particularly advantageous as regards a compact arrangement of the components with at the same time ease of accessibility of the individual components and the possibility of a sufficient and effective cooling. The arrangement can obviously also be implemented in the reverse order. A vertical arrangement, as illustrated, of the components in the power switch cabinet 36 is preferred on account of the ease of accessibility and thermal effects during cooling. Here the natural convection can assist the cooling. A decentralised control unit 32 as well as an intermediate circuit precharging unit can in this case be flexibly arranged in the power switch cabinet 36. Also, a cooling device 38 extends as a rule over a plurality of components in the power switch cabinet 36. It is however advantageous to provide a cooling in the form of an air-water heat exchanger between the power module 6 and the line choke 39. The individual components can be cooled by means of water and air, preferably by convection. Also a mains filter 40 can optionally be provided in the power switch cabinet 36.

Figure 3:
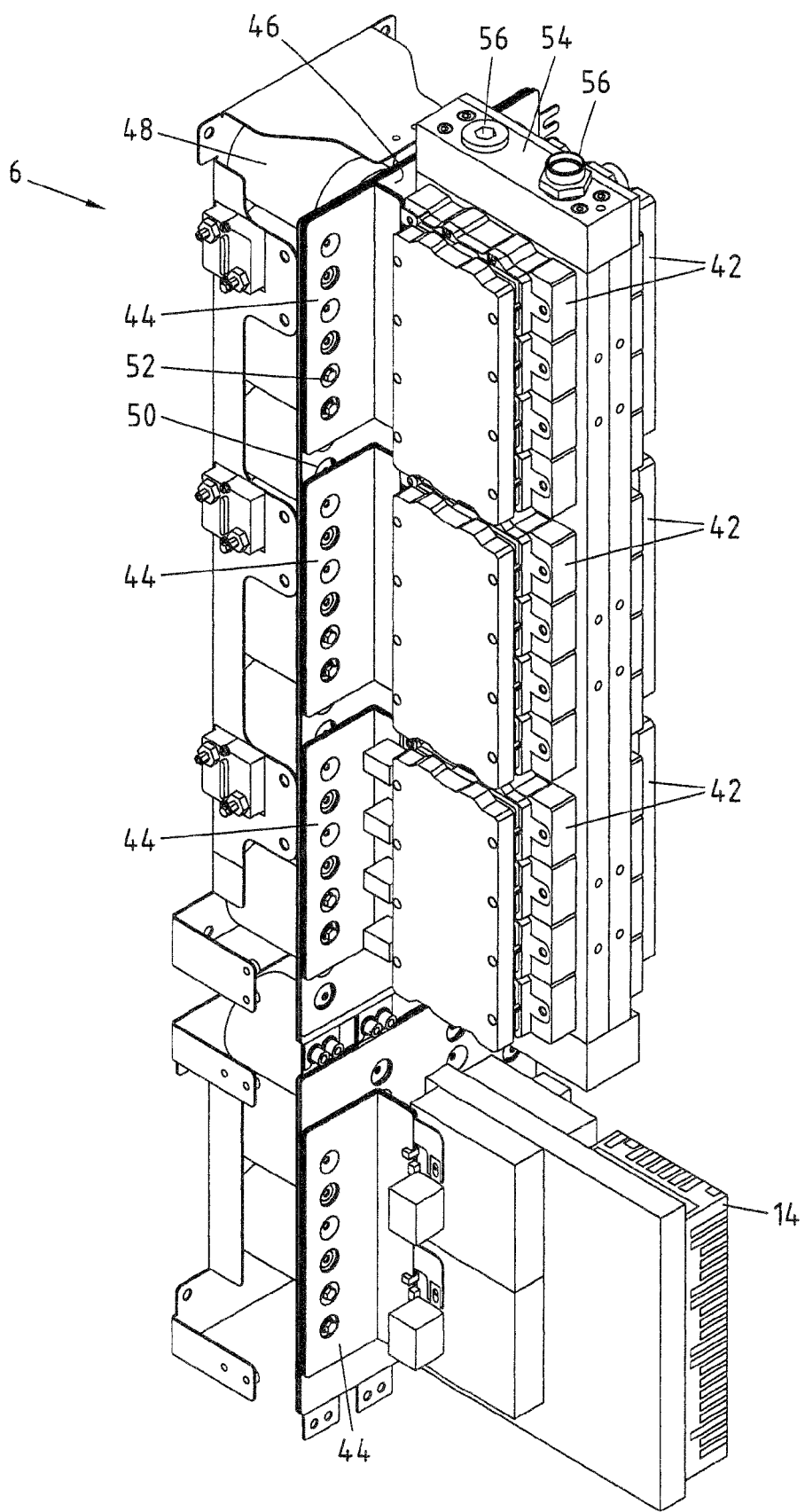
FIG. 3 shows in a perspective view an exemplary embodiment of a power module with chopper.

FIG. 3 now shows in a perspective view an exemplary embodiment of a power module 6 with chopper 14. A plurality of electronic power switches 42 in the form of IGBTs are connected by means of adapter busbars 44 to a direct current busbar 46. The electronic power switches 42 are all arranged on one side of the direct current busbar 46. A capacitor bank 48 is arranged on the opposite side of the direct current busbar 46. It can furthermore be seen how the capacitor bank 48 is electrically connected via a first spacing (not shown) and the electronic power switches 42 with the adapter busbar 44 are electrically connected via a second spacing 52 to the direct current busbar 46. Preferably rectangular adapter busbars 44 are used so as to enable the power switches and the chopper to be positioned outside the plane of the direct current busbar. This arrangement of the power switches ensures an improved cooling of the power switches or also of the chopper.

Furthermore a chopper 14 is also connected to the direct current busbar 46. The chopper 14 serves to protect the capacitor bank 48 as well as the electronic power switches 42 against excess voltages. The combination of the electronic power switches 42 together with a chopper 14 additionally arranged on the direct current busbar 46 enables the chopper 14 to be directly connected to the capacitor bank 48. A cable connection between the direct current busbar 46 and the chopper 14 is thus avoided. Since the intermediate circuit voltage is normally above 1000 V, this is advantageous both from safety-related aspects and also with regard to the electromagnetic compatibility of the power module 6. Furthermore a reduction of the spatial requirement is also achieved.

The power module 6 of FIG. 3 furthermore comprises a cooling body 54 with coolant connections 56. Owing to the arrangement of a cooling body 54 between the electronic power switches 42 these can be effectively cooled with a single cooling body 54 and arranged in a compact manner.

Figure 4:
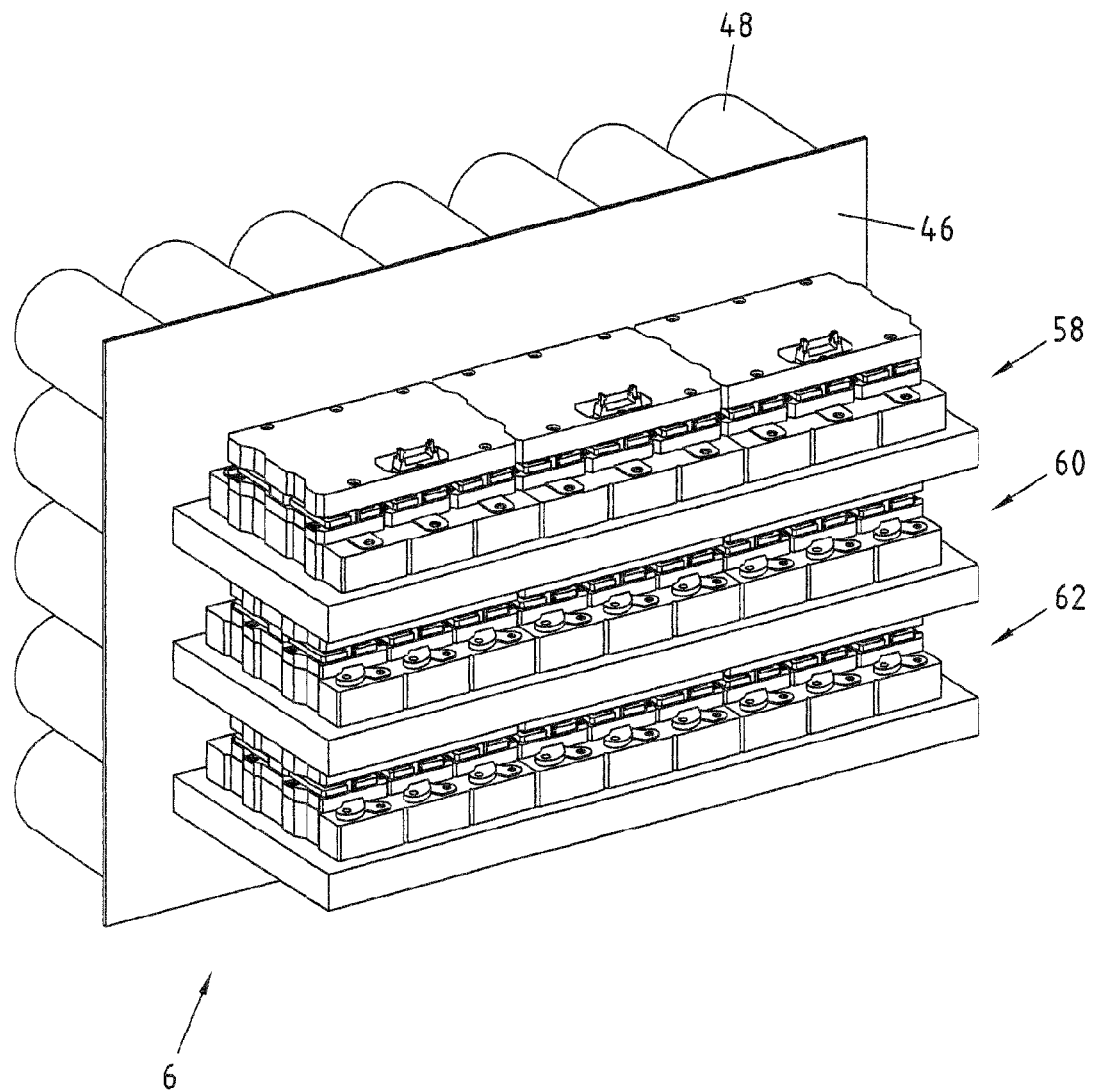
FIG. 4 shows in a perspective view a further embodiment of a power module.

FIG. 4 shows in a perspective view a further exemplary embodiment of a power module 6. The electronic power switches 42 are assembled in three structural groups 58, 60, 62, and are arranged on the direct current busbar 46. Each of these structural groups includes a cooling body, preferably for water cooling. The capacitor bank 48 is in turn arranged on the opposite side. It is particularly preferred if the structural groups 58, 62 comprise the electronic power switches 8', 10' of the converters 8, 10, while the middle structural group 60 comprises the electronic power switch or switches of the chopper 14 and also optionally the resistor 18. As can readily be seen, individual structural units 58, 60, 62 can be replaced in a simple manner if these are for example faulty. Furthermore a scalability can be achieved very easily by adding or removing further structural units 58, 60, 62.

Figure 5:
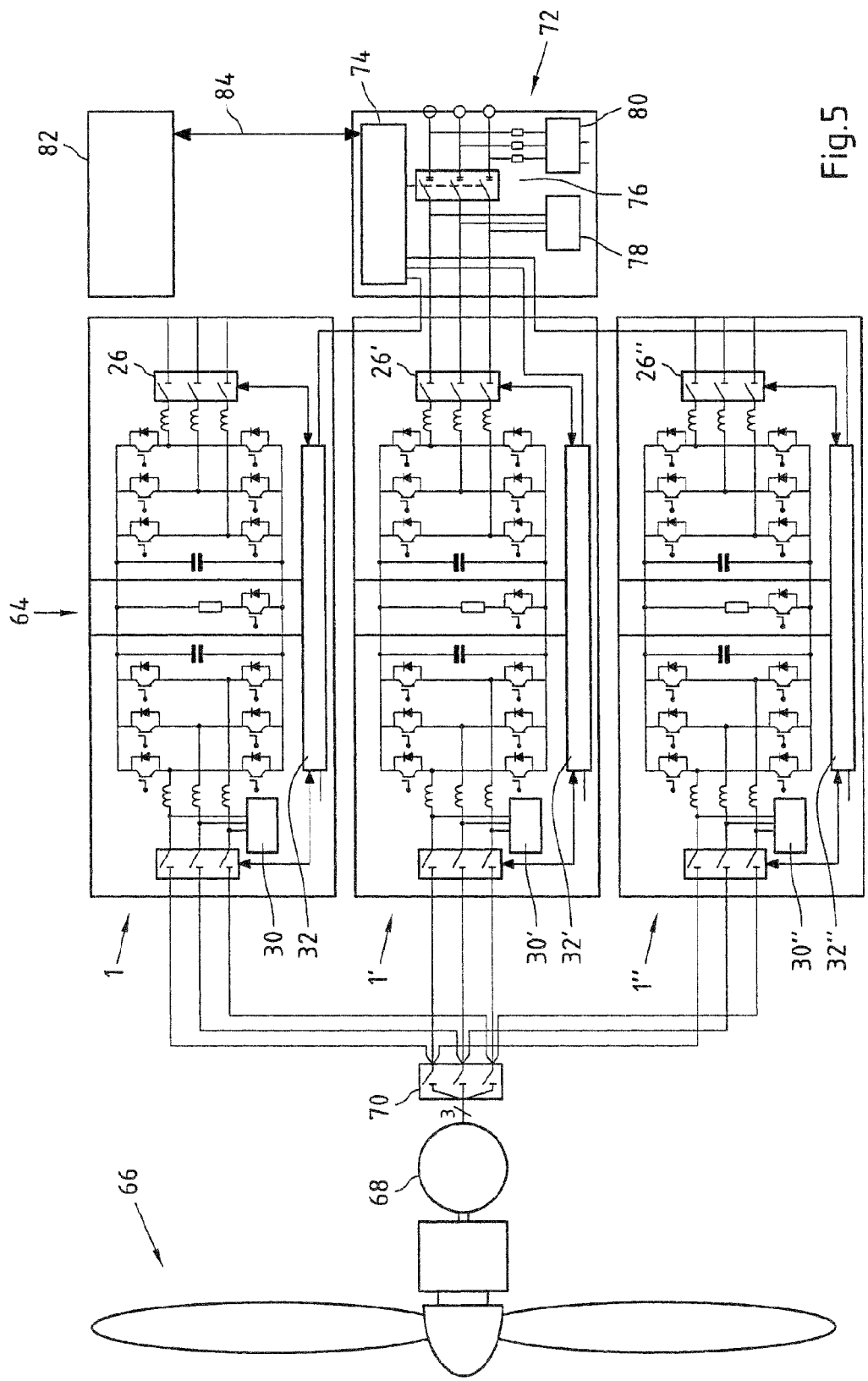
FIG. 5 shows schematically in the form of a circuit diagram the construction of an exemplary embodiment of a switch cabinet arrangement of a wind turbine.

FIG. 5 shows schematically in the form of a circuit diagram the construction of an exemplary embodiment of a switch cabinet arrangement 64. This comprises the power switch cabinet 1 of FIG. 1 and two further, preferably structurally identical, power switch cabinets 1', 1". The power switch cabinets 1, 1', 1" are connected in parallel. It is also conceivable to provide power switch cabinets 1, 1', 1" of different design in a switch cabinet arrangement 64, in order possibly to achieve a better output adaptation. Also, it is of course conceivable to provide only two or more than three power switch cabinets. A permanent-field magnetic synchronous generator 68 is driven by a rotor 66. The generator is connected in an electrically conducting manner via a generator switch 70, which may optionally be provided in a generator connection cabinet (not shown), to the power switch cabinets 1, 1', 1".

On the mains side the power switch cabinets 1, 1', 1" are electrically connected to a mains connection switch cabinet 72. This comprises a central control unit 74, a main switch 76, a mains filter 78 and an auxiliary supply 80. The mains filter 78 is in this way connected upstream of all power switch cabinets 1, 1', 1" and does not have to be implemented separately in each power switch cabinet. However, it is possible to provide the mains filter 78 in the power switch cabinets 1, 1', 1". The mains switch 76 can for example also be an electronic power switch, in order to isolate quickly and simply the power switch cabinets 1, 1', 1" from the mains. It can readily be seen that, apart from the conducting connections of the mains connections 26, 26', 26" to the mains connection switch cabinet 72, only one connection of the decentralised control units 32, 32', 32" to the central control unit 74 as well as one connection of the auxiliary voltage power supply unit 80 to the power switch cabinets 1, 1', 1" is necessary. A low installation expenditure and an optimum scalability of the switch cabinet arrangement 64 is achieved in this way. In this exemplary embodiment the central control 72 is connected to a wind turbine control 82 via a data connection 84. The wind turbine control 82 can for example provide data regarding the generator 68 or the rotor 66 or influence these, or set target output or target current values. Various interfaces and buses, such as Ethernet, CANOpen or other digital or analogue inputs and outputs may be provided as data connection 84.

Figure 6:
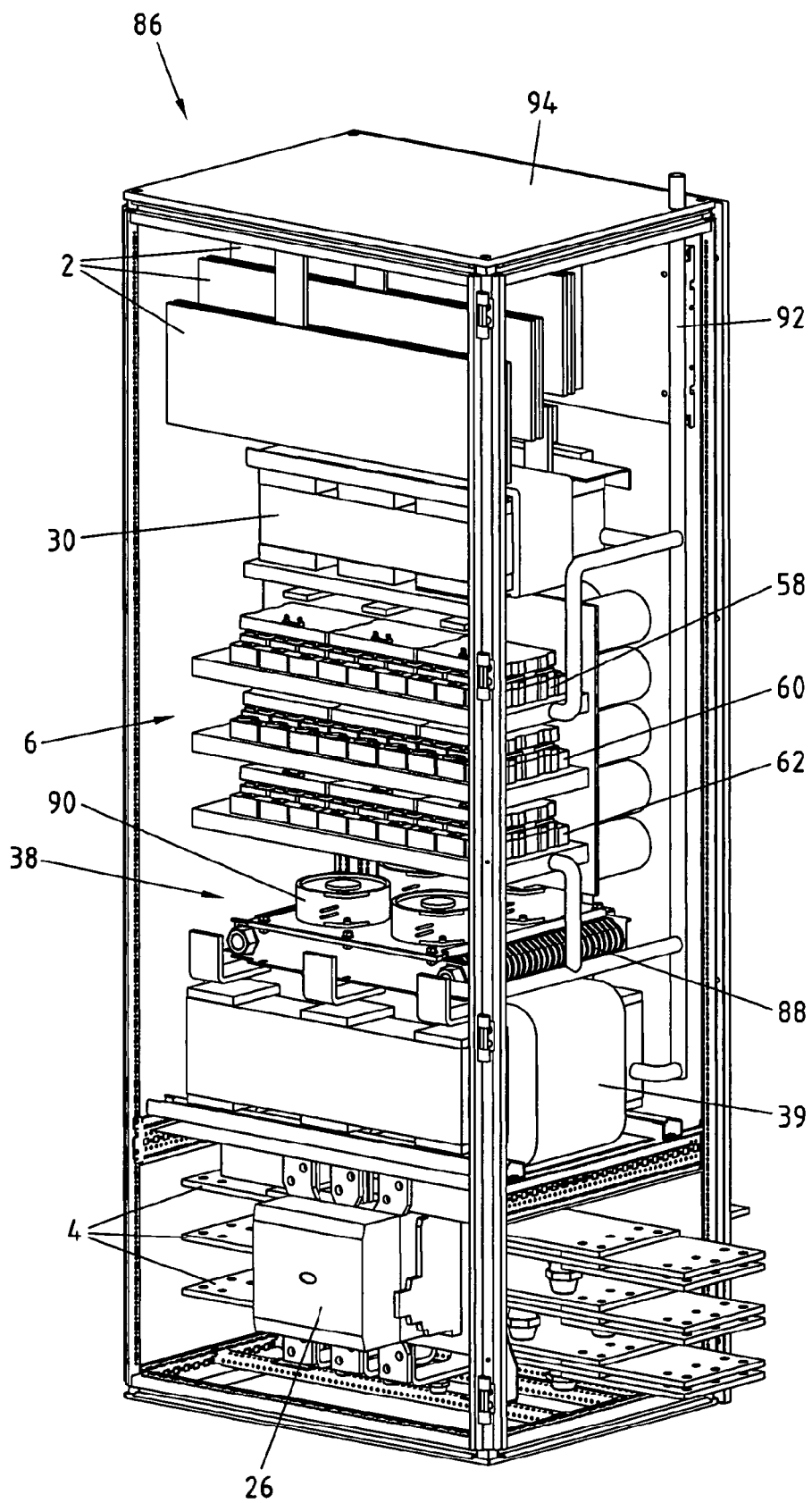
FIG. 6 shows in a perspective view a further exemplary embodiment of a power switch cabinet.

FIG. 6 shows in a perspective view a further exemplary embodiment of a power switch cabinet 86. The power switch cabinet 86 comprises A.C. rails as mains and machine connections 2, 4. These are designed for three-phase alternating current. The A.C. rails for the mains connection 4 are arranged horizontally above one another, while the A.C. rails for the machine connection 2 are arranged vertically behind one another. However, other arrangements are also conceivable. A contactor 26 is arranged in the region of the mains connection 4.

Above the mains connection 4 a line choke 39 is integrated into the power switch cabinet 86. A cooling device 38 comprising an air-water heat exchanger 88 and a fan 90 is installed above this. The line choke 39 can be cooled in particular by the water cooling circuit 92.

The power module 6 of FIG. 4 is arranged above the fan 90. However, other embodiments of the power module can also be arranged here. Thanks to this arrangement the capacitor bank 48 of the power module 6 in particular can be effectively cooled by the fan 90. The structural groups 58, 60, 62 are in this connection cooled by the water cooling circuit 92, or before initial use are also optionally heated in order to bring them to the operating temperature.

The dU/dt filter 30 is arranged above the power module 6, and is likewise cooled by the cooling device 38.

Finally, the machine connection 2 in the form of A.C. rails is arranged above the dU/dt filter 30.

It can readily be seen how the individual components in the power switch cabinet 86 in the frame 94 are arranged substantially vertically aligned in a row. A substantially horizontal arrangement or an arrangement in the reverse order is of course also possible. Due to the arrangement in the given order, which essentially corresponds to the direction of the power flow, the components in the power switch cabinet 86 can be arranged in a very compact and easily accessible manner, and at the same time can be sufficiently cooled.

Figure 7:
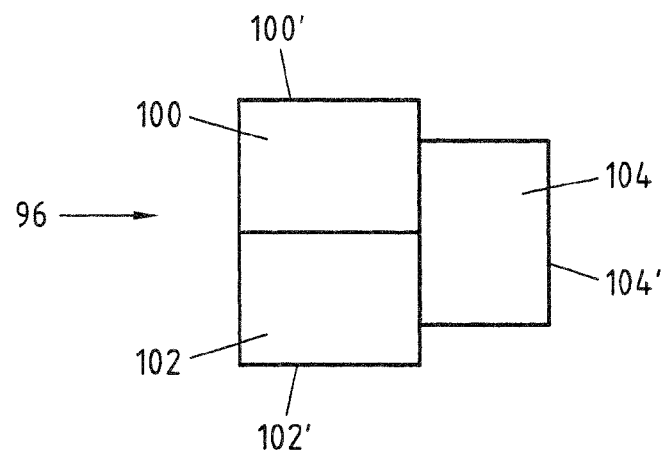
FIG. 7 shows various exemplary embodiments of a switch cabinet arrangement.
Figure 7:
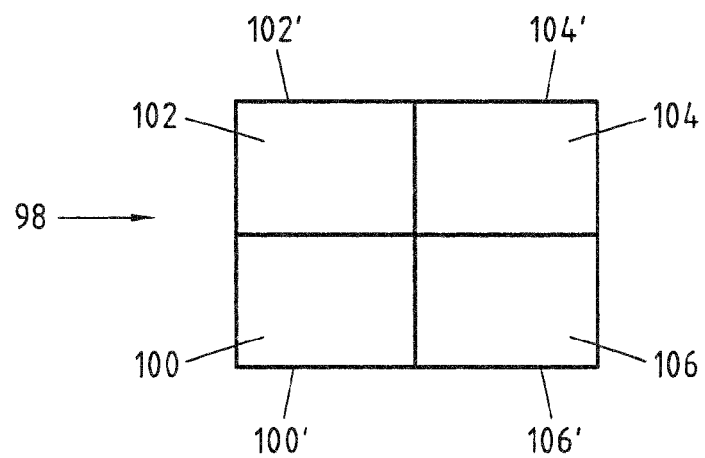

FIG. 7 shows various embodiments of a switch cabinet arrangement 96, 98 according to the invention. The switch cabinet arrangement 96 shows three switch cabinets 100, 102, 104 from above. Here the switch cabinets 100, 102 are arranged back to back, while the switch cabinet 104 is arranged on the side cross-wise to the switch cabinets 100, 102. The switch cabinets 100, 102, 104 are in particular power switch cabinets, wherein preferably one of the switch cabinets 100, 102, 104 is also a mains connection switch cabinet. It is particularly advantageous in this arrangement if the A.C. rails in the power switch cabinets 100 and 102 are designed only for the respective rated currents. Only in the mains connection switch cabinet 104 are the A.C. rails assembled for connection to the mains, so that only in this switch cabinet do the A.C. rails have to be designed for the sum of the rated currents of the two switch cabinets 100 and 102. The expense of copper connections can thereby be saved.

The switch cabinet arrangement 98 now shows four switch cabinets 100, 102, 104, 106, above. The switch cabinets 100, 106 and 102, 104 are in each case arranged laterally next to one another, while the switch cabinets 100, 102 and 106, 104 are in each case arranged back-to-back. The switch cabinets 100, 102, 104, 106 are in particular power switch cabinets, wherein preferably one of the switch cabinets 100, 102, 104, 106 is also a mains connection switch cabinet.

Of course, another geometrical arrangement of the switch cabinets is also possible, in particular lateral arrangements in series or arrangements above one another, or arrangements with fewer than three or more than four switch cabinets.

It can clearly be seen that, owing to the switch cabinet arrangements 96, 98, a space-saving arrangement is possible, in which at the same time an easy access to the components of each switch cabinet is possible via the front sides 100', 102', 104', 106'. For the corresponding arrangements simply the mains and machine connections 2, 4 have to be arranged so that the corresponding arrangement is possible.

Figure 8:
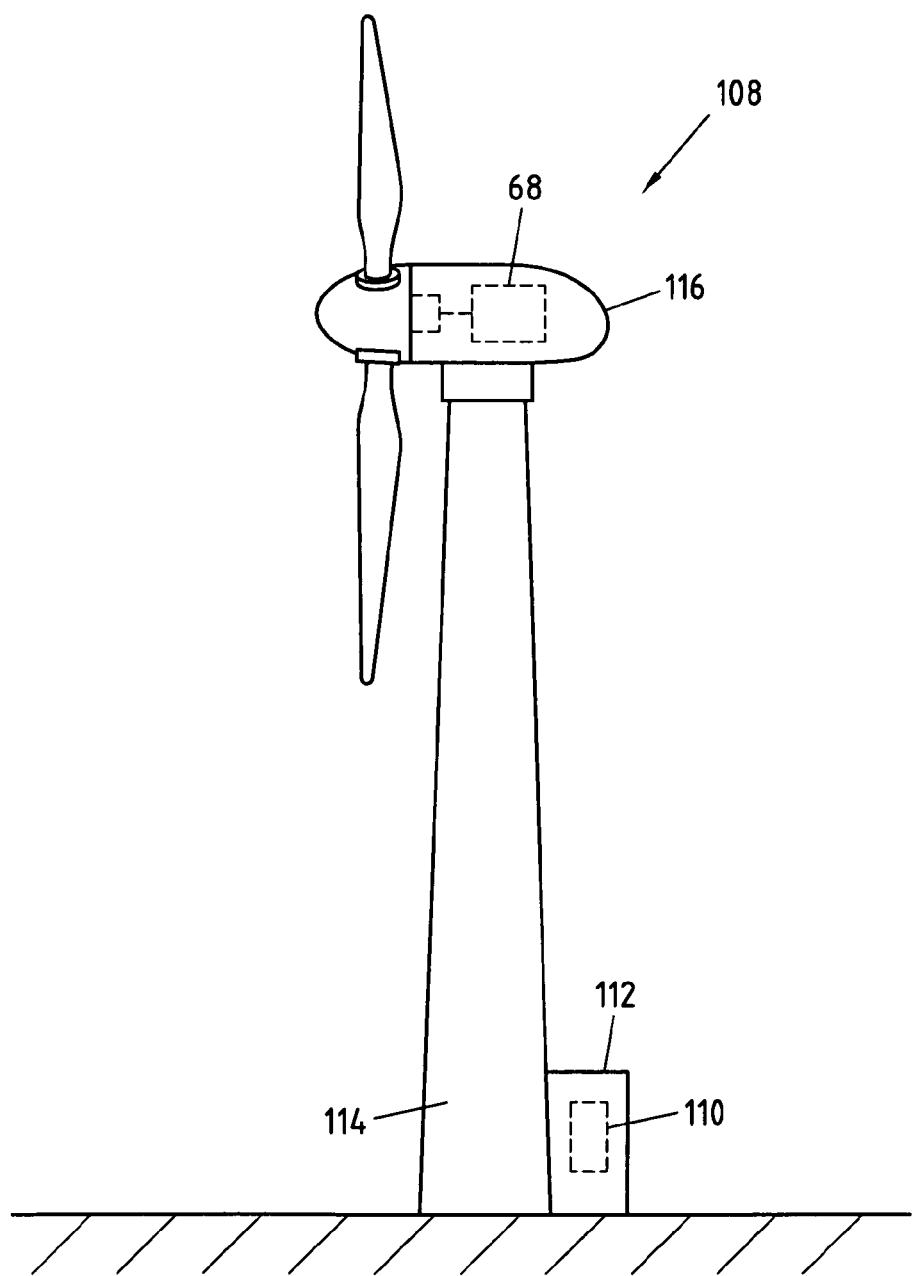
FIG. 8 shows in a schematic view an exemplary embodiment of a wind turbine with a switch cabinet arrangement.

FIG. 8 now shows a schematic representation of a wind turbine 108 with a switch cabinet arrangement 110 according to the invention. This may be designed for example like the switch cabinet arrangements 64, 96 or 98. The switch cabinet arrangement 110 is installed in a housing 112 at the foot of the wind turbine 108. The switch cabinet arrangement 110 can however also be arranged inside the tower 114 or in the vicinity of the generator 68, thus for example in the nacelle 116 of the wind turbine 108. On account of the small available space in wind turbines, in particular in the nacelle 116 and in the tower 114, as well as the necessary adaptation of the wind turbines 108 to different output ranges, the use of the switch cabinet arrangement 110 according to the invention for wind turbines 108 is particularly advantageous.

The invention claimed is:

1. Switch cabinet arrangement of a device for generating electrical energy, wherein the switch cabinet arrangement comprises at least two separate power switch cabinets, wherein the power switch cabinets comprise respectively:
 a machine connection,
 a power module,
 a mains connection, and
 a decentralised control unit,
 wherein the power module comprises
 a machine converter,
 a mains converter,
 a direct voltage intermediate circuit, and
 a chopper,
 and wherein the power switch cabinets are electrically connected in parallel to one another via the mains connection and optionally via the machine connection.

2. Switch cabinet arrangement according to claim 1, wherein alternatively the power switch cabinets are respectively connected individually to the mains via associated secondary windings of one or a plurality of transformers.

3. Switch cabinet arrangement according to claim 1, wherein the power module comprises a plate-shaped direct current busbar, which comprises on a first side a power switch and a chopper and on a second side capacitors of the direct voltage intermediate circuit.

4. Switch cabinet arrangement according to claim 1, wherein the power switch cabinets respectively comprise a dU/dt filter.

5. Switch cabinet arrangement according to claim 1, wherein the power switch cabinets comprise line choke on the mains side.

6. Switch cabinet arrangement according to claim 1, wherein the power switch cabinets on mains connections and/or on the machine connections comprise respectively devices connected upstream for an electrical isolation of the power switch cabinets.

7. Switch cabinet arrangement according to claim 1, wherein the power switch cabinets comprise respectively a cooling device, in particular a heat exchanger.

8. Switch cabinet arrangement according to claim 1, wherein the power switch cabinets are hermetically sealed against ambient air.

9. Switch cabinet arrangement according to claim 1, wherein the power switch cabinets are electrically connected in parallel by means of A.C. rails.

10. Switch cabinet arrangement according to claim 1, wherein the power switch cabinets are arranged laterally in series and/or back-to-back.

11. Switch cabinet arrangement according to claim 1, wherein the switch cabinet arrangement comprises a separate mains connection switch cabinet, which contains a central control unit.

12. Switch cabinet arrangement according to claim 11, wherein the mains connection switch cabinet comprises at least one mains filter.

13. Switch cabinet arrangement according to claim 11, wherein the mains connection switch cabinet comprises an auxiliary voltage supply and/or a mains switch.

14. Switch cabinet arrangement according to claim 1, wherein a central control unit and decentralised control units are provided, which can be connected to one another via fibre optics.

15. Device for generating electrical energy, wherein the device comprises a switch cabinet arrangement according to claim 1.

16. Device for generating electrical energy according to claim 15, wherein the device is designed as a wind turbine with a generator, in particular as a wind turbine of an offshore wind farm.

\* \* \* \* \*